United States Patent
Huber

(10) Patent No.: US 6,181,582 B1
(45) Date of Patent: Jan. 30, 2001

(54) METHOD AND CIRCUIT ARRANGEMENT FOR GENERATING A REPRESENTATION OF THE SUPPLY VOLTAGE IN A FREQUENCY CONVERTER

(75) Inventor: Norbert Huber, Teisendorf (DE)

(73) Assignee: Dr. Johannes Heidenhain GmbH, Traunreut (DE)

(*) Notice: Under 35 U.S.C. 154(b), the term of this patent shall be extended for 0 days.

(21) Appl. No.: 09/518,052

(22) Filed: Mar. 2, 2000

(30) Foreign Application Priority Data

May 3, 1999 (DE) .............................. 199 09 706

(51) Int. Cl.⁷ .............................. H02M 1/12; H02M 1/14
(52) U.S. Cl. .................................. 363/39; 363/47
(58) Field of Search .................. 363/39, 44, 47, 363/48, 40

(56) References Cited

U.S. PATENT DOCUMENTS

| | | | |
|---|---|---|---|
| 4,507,619 * | 3/1985 | Dijkstra et al. ................... | 330/297 |
| 4,935,691 * | 6/1990 | Lamar ................................. | 323/323 |
| 5,631,546 * | 5/1997 | Heinke ............................... | 323/267 |
| 5,859,512 * | 1/1999 | Buthker ............................. | 318/254 |

* cited by examiner

Primary Examiner—Peter S. Wong
Assistant Examiner—Bao Q. Vu
(74) Attorney, Agent, or Firm—Brinks Hofer Gilson & Lione

(57) ABSTRACT

A circuit arrangement for generating representations of supply voltages that includes a first path that receives control signals, the first path having a subtracter for forming a difference signal from two of the control signals and a low pass filter to receive the difference signal. A second path receives the control signals, the second path includes a second low pass filters that passes frequencies higher than the first low pass filter does. Output signals of the first and second paths are fed to a combination network which, as a function of the difference between the output signals of the first and second paths, passes on the output signals of one of the first and second paths.

26 Claims, 1 Drawing Sheet

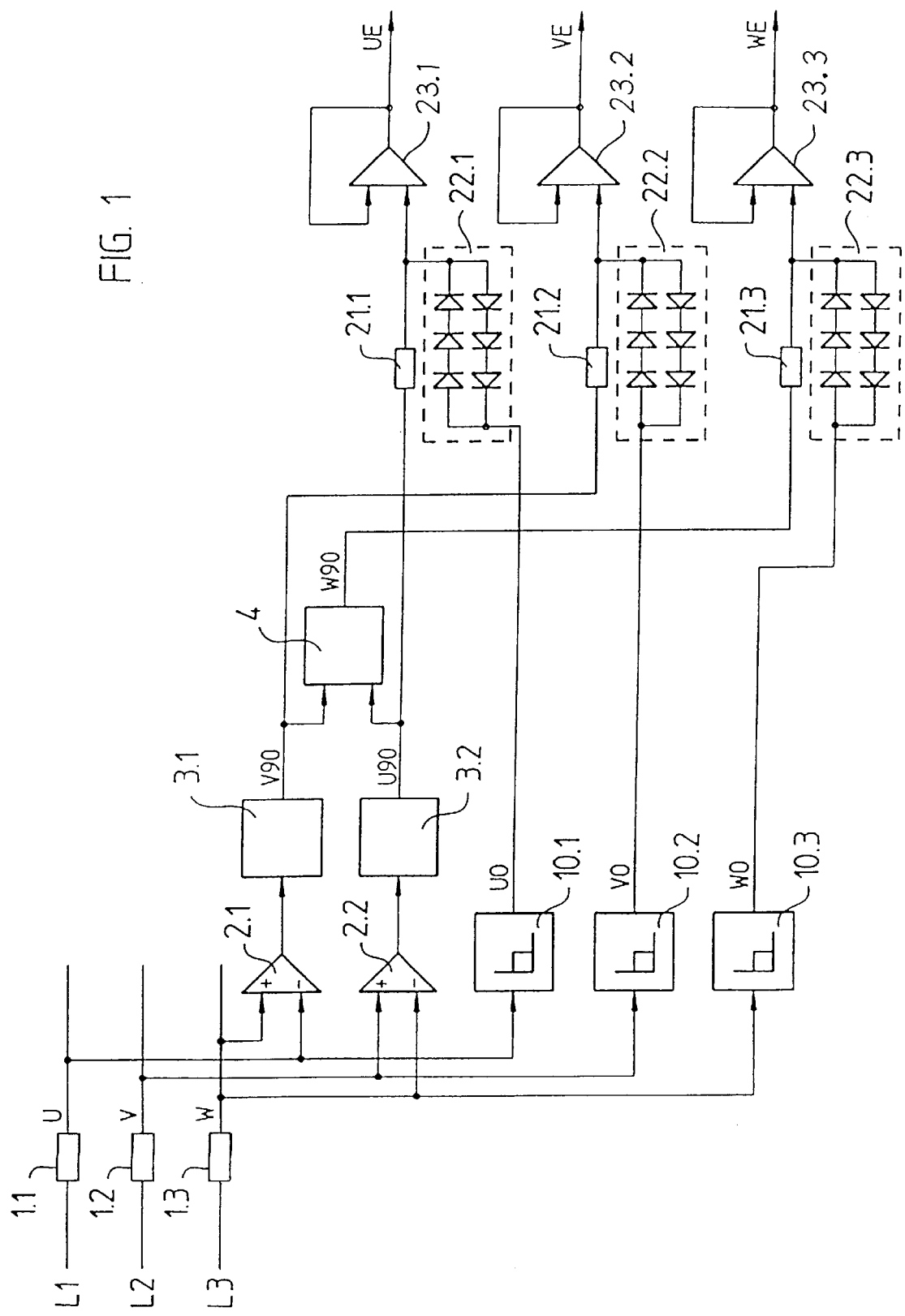

METHOD AND CIRCUIT ARRANGEMENT FOR GENERATING A REPRESENTATION OF THE SUPPLY VOLTAGE IN A FREQUENCY CONVERTER

Applicant claims, under 35 U.S.C. §119, the benefit of priority of the filing date of Mar. 5, 1999 of a German patent application, copy attached, Ser. No. 199 09 706.2, filed on the aforementioned date, the entire contents of which is incorporated herein by reference.

BACKGROUND OF THE INVENTION

1. Field of the Invention

The invention relates to a method for generating a representation of the supply voltage in connection with service devices that are capable of feedback to a supply line, in particular for frequency converters of electric motors. The invention further relates to a circuit arrangement for executing the method.

2. Discussion of Related Art

Frequency converters for electric motors of machine tools are known from the prior art, which feed the energy, which is being generated in the course of braking the electric motors, back into the supply system. To feed the energy back into the power supply, the electric motors are operated in a generator mode. The voltage output by the electric motors is initially rectified and thereafter converted to a voltage that has the same frequency and phase position as the supply voltage. In a three-phase rotary current system, at least two such voltages must be selected for feedback, the third voltage can then be calculated from the two known ones. The voltages determined in this manner are called representations of the supply voltages.

In order to keep the outlay for wires as low as possible, for determining the representation of the supply voltage it is advantageous to pick up the required control signals from the supply system downstream of the commutating chokes, to which a signal, which is proportional to the supply voltage and is pulse-width-modulated, has been applied. Since the supply voltage has been modulated by the pulse width modulation at this point, a low pass filter is required for demodulating the supply voltage. This filter should rotate the phase as little as possible, but should demodulate the pulse width modulation as well as possible. A low pass filter of a critical frequency of approximately 2 kHz is used for this.

A disadvantage of such a filter is that harmonics of the supply frequency are not suppressed. The result of this is that in case of a connection to a supply system with a relatively high internal resistance (for example because of the use of a power supply transformer for matching the supply voltage), an oscillation tendency can easily occur. This applies in particular in feedback, since a positive feedback relative to the harmonics can occur.

These disadvantages are avoided when using so-called −90 degree filters. Two of three supply voltages of a rotary current supply system are fed to such a filter, the difference between the two is formed in an upstream-connected subtracter, and this difference is rotated by −90 degrees of angle by the filter. By means of this a representation of the third phase is generated. A −90 degree filter is a low pass filter of a very low critical frequency (for example 2 Hz), which generates a phase rotation of almost −90 degrees at 50 Hz. The exact rotation of over −90 degrees is achieved by a second filter of a critical frequency of approximately 1.25 kHz and connected in series. If no rotation of exactly −90 degrees is required, the second filter can also be omitted.

This circuit has the advantage that all harmonics are satisfactorily damped out of the supply frequency because of the low critical frequency, so that therefore no sinusoidal voltage with a very low distortion degree is available.

However, the disadvantage of this circuit arrangement, also known from the prior art, lies in that the determination of the representation of the supply voltage is erroneous if a supply voltage fails, since the other two supply voltages are determined from the failed supply voltage. The result of this is that, if one of the three supply voltages fails, the phase current and the intermediate circuit voltage very quickly assume extreme values because of the erroneous triggering.

OBJECT AND SUMMARY OF THE INVENTION

It is therefore a n object of the present invention to recite a method for reproducing the supply voltage, wherein an oscillating tendency because of the positive feedback of the harmonics is avoided, and also no impermissibly high currents are generated in case of the failure of a supply voltage phase. This method moreover is to be realized by the simplest and most cost-effective circuit arrangement possible.

The above object is attained by a method for generating a representation of supply voltages that includes generating control signals from supply voltages, supplying the control signals to a first path and a second path. The control signals of the first path are processed by forming a difference signal from two of the control signals, low pass filtering the difference signal and rotating the low pass filtered difference signal by −90 degrees of angle. Simultaneously, the control signals in the second path are processed by low pass filtering. The method further includes selecting either the rotated low pass filtered difference signal of the first path or the low pass filtered control signals of the second path as function of the difference between the rotated low pass filtered difference signal of the first path and the low pass filtered control signals of the second path.

The above object is attained by a circuit arrangement for generating a representation of the supply voltages that includes a first path that receives control signals, the first path having a subtracter for forming a difference signal from two of the control signals and a low pass filter to receive the difference signal. A second path receives the control signals, the second path includes a second low pass filters that passes frequencies higher than the first low pass filter does. Output signals of the first and second paths are fed to a combination network which, as a function of the difference between the output signals of the first and second paths, passes on the output signals of one of the first and second paths.

The method in accordance with the present invention has the advantage that an automatic switch is performed between the two known methods for reproducing the supply voltage. For example, if no impermissible values for phase voltages and phase currents appear, the reproduction of the supply voltages is determined in a known manner by a −90 degree filter. However, impermissible phase currents would be set as soon as a power supply voltage fails. As soon as the difference between the output voltages of the −90 degree filter and the filter with the higher critical frequency in the first and second path becomes greater than the threshold voltages of the diodes of the combination network, the low pass filters of the higher critical frequency in the second path automatically take over the control of the phase voltages. This is achieved in that the −90 degree filters are coupled in a high-ohmic manner to the summing point of the output signals of the first and second paths, but the filters of the first path via a diode series connection.

Thus, the reproduction of the supply voltages in the range of permissible values for the intermediate circuit voltage or for the phase currents is determined by the −90 degree filters. But as soon as the difference between the output signals of the first and second path exceeds a defined threshold value, which is set by the number and threshold voltages of the diodes, the supply system reproduction is determined by the low pass filters of a higher critical frequency. Because of the employment of the low pass filters of a higher critical frequency for determining the supply system reproduction, it is then possible to prevent impermissibly higher values of the intermediate circuit voltage and of the phase currents.

Details of the invention will be further explained in what follows by means of the embodiment represented in the drawings.

BRIEF DESCRIPTION OF THE DRAWINGS

The single drawing FIGURE represents a first embodiment of a circuit arrangement in accordance with the present invention.

DETAILED DESCRIPTION OF THE PREFERRED EMBODIMENT

The exemplary embodiment that follows is based on a three-phase rotary current system, to which a service device capable of feedback for a frequency converter of a machine tool is connected. Electric motors of a machine tool are supplied with electric energy by the frequency converter. As soon as the electric motors are braked, energy is fed back into the supply system, so that this does not lead to heating of the electric motor or to brake resistance in the frequency converter. For the purpose of feeding the kinetic energy of the electric motor back, it is operated in the generating mode by the control connected to it, and the kinetic energy is converted into electric energy. This electric energy is fed back into the supply system via the intermediate circuit of the frequency converter. It is well known that the intermediate circuit is that part of the frequency converter that usually stores energy from the power supply line before it is transferred to an ac motor. The intermediate circuit also stores energy that is fed back from the motor to the power supply line if the motor is operated as a generator. For feedback of electrical energy into the supply system via the intermediate circuit, it is necessary to set the frequency and the phase position of the power supply voltages by a service device, such as a frequency converter, which is capable of feedback. It is necessary for this purpose to determine the frequency and phase positions of the supply voltage in the form of a representation of the supply voltage.

In accordance with the present invention, this takes place on two paths, as shown in FIG. 1. In a first path, respectively, two different signals, which are proportional to the three supply voltages L1, L2 and L3, but which are pulse-width-modulated, are picked up at the commutating chokes 1.1, 1.2 and 1.3 and are conducted to respective subtractors 2.1 and 2.2, which form the difference from the two supplied signal voltages U, V and/or W. The output signals of the subtractors 2.1 and 2.2 are respectively conducted to −90 degree filters 3.1 and 3.2, which have a critical frequency in the range between approximately 1 Hz to 10 Hz. The difference voltages are low pass filtered by these −90 degree filters 3.1 and 3.2, and the phase positions are rotated by −90 degrees of angle, so that the output signals V90 and U90 are generated. The still missing third output signal W90 is generated by forming the difference of these two output signals V90 and U90 in a further subtracter 4.

In a second path, which is parallel with the first, each one of the three pulse-width-modulated signal voltages U, V and W, which are proportional to the supply voltages L1, L2 and L3, are simultaneously low pass filtered in low pass filters 10.1, 10.2 and 10.3 of a critical frequency in the range between approximately 1 kHz to 3 kHz. The signal voltages U, V and W are demodulated by this, and a representation of the supply voltages is also generated in this second pass. The same as in the first path, it is also alternatively possible in the second path to determine one of the three signal voltages from the difference between the two others. Therefore, a subtracter is required at this point in place of a third low pass filter of a higher critical frequency.

The output signals V90 and U90 of the −90 degree filters 3.1 and 3.2, as well as the output signal W90 of the subtracter 4 are fed to amplifiers via resistors 21.1, 21.2 and 21.3. The output signals of the low pass filters 10.1, 10.2 and 10.3 of higher critical frequencies are also fed to the same inputs of the amplifiers via diode networks 22.1, 22.2 and 22.3.

By the special combination of the output signals V90, U90 and W90, as well as the signals UO, VO and WO of the parallel connected −90 degree filters 3.1, 3.2 and 3.3, of the subtracter 4 and of the filters 10.1, 10.2 and 10.3 of higher critical frequencies in a combination network, the regulation of the intermediate circuit voltage is exclusively performed by the −90 degree filters 3.1 and 3.2, if the difference between the output signals V90, U90 and W90 of the −90 degree filters 3.1, 3.2 and of the subtracter 4, as well as the filters 10.1, 10.2 and 10.3 of higher critical frequencies is small. In this type of operation, the diodes 22.1, 22.2 and 22.3, through which the filters 10.1, 10.2 and 10.3 of higher critical frequencies are connected with the amplifiers 23.1, 23.2, 23.3, respectively, block the transmission of the signals UO, VO and WO to the amplifiers 23.1–.3, respectively. Because the −90 degree filters 3.1 and 3.2 strongly damp harmonics, an oscillating tendency can be prevented.

But if the difference between the output signals V90, U90 and W90 of the −90 degree filters 3.1, 3.2, as well as of the subtracter 4 and the output signals UO, VO and WO of the filters 10.1, 10.2 and 10.3 of higher critical frequencies rises considerably, for example because of the failure of a supply voltage, the threshold voltages of the diodes 22.1, 22.2 and 22.3 of the combination network are exceeded. As soon as the threshold voltages of the diodes 22.1, 22.2 and 22.3, through which the output signals UO, VO and WO of the filters 10.1, 10.2 and 10.3 of higher critical frequencies are connected with the amplifiers, are exceeded, the amplifiers are essentially triggered via the output signals UO, VO and WO of the filters 10.1, 10.2 and 10.3 of higher critical frequencies. Because the output signals V90, U90 and W90 of the −90 degree filters are respectively connected in a high-ohmic manner with the amplifier inputs via a resistor 21.1, 21.2 and 21.3, the input signals of the amplifiers are determined by the output signals UO, VO and WO of the filters 10.1, 10.2 and 10.3 of higher critical frequencies, since these are connected in a low-ohmic manner with the amplifier inputs after the diodes have been switched through.

By this, the supply system representation for small differences of the output voltages UO, VO and WO, as well as V90, U90 and W90 of the filters 3.1, 3.2 and 10.1, 10.2, as well as 10.3, is determined in both paths by the −90 degree filters 3.1 and 3.2, for large differences of the output voltages UO, VO and WO, as well as V90, U90 and W90 of the filters 3.1, 3.2 and 10.1,10.2, as well as 10.3, in both paths by the filters 10.1, 10.2 and 10.3 of higher critical frequencies. At large differences of the output voltages UO, VO and WO, as well as V90, U90 and W90 of the filters 3.1, 3.2 and 10.1, 10.2, as well as 10.3, in both paths it is assumed that one phase of the supply voltage has failed and the −90 degree filters 3.1 and 3.2 no longer provide a correct representation of the power supply voltage. Therefore, the representation of the supply voltage is automatically determined by the filters 10.1, 10.2 and 10.3 of higher critical frequencies in order to prevent too great values of the intermediate circuit voltage and the phase current as quickly as possible.

As a rule, a circuit for monitoring the supply voltages is also provided which, however, only reacts somewhat later and then shuts the frequency converter off, for example.

Thus, the resistors 21.1, 21.2 and 21.3 connected downstream of the −90 degree filters 3.1 and 3.2 and the subtracter 4, and the diodes 22.1, 22.2 and 22.3 connected downstream of the filters 10.1, 10.2 and 10.3 of higher critical frequencies, a selective circuit is realized, which for regulation selects the output signals of one path as a function of the output signals of both paths. In the course of this the respective output signals with the same phase position in different paths are compared with each other, i.e. UO with U90, VO with V90, and WO with W90.

Filters of the third order with a critical frequency between 1 kHz and 3 kHz are preferably selected as the filters 10.1, 10.2 and 10.3 of higher critical frequencies. The −90 degree filters 3.1 and 3.2 have a critical frequency of approximately 1 to 10 Hz and rotate the output signal V90 and U90 by approximately −90 degrees in relation to the input signal. Alternatively to the subtracter 4, it is also possible to provide an additional subtracter and −90 degree filter for generating the third output signal W90, which must be connected analogously with the already provided subtractors 2.1 and 2.2, or respectively the −90 degree filters 3.1 and 3.2.

The invention may be embodied in other forms than those specifically disclosed herein without departing from its spirit or essential characteristics. For example, the method of the present invention and the circuit arrangement of the present invention can be used in all those cases where the energy of an electric motor is to be fed back into a supply system and therefore the phase must be matched to the supply system. The described embodiments are to be considered in all respects only as illustrative and not restrictive, and the scope of the invention is commensurate with the appended claims rather than the foregoing description.

I claim:

1. A method for generating representations of supply voltages, the method comprising:

generating control signals from supply voltages;

supplying said control signals to a first path and a second path;

processing said control signals with said first path by:

forming a difference signal from two of said control signals;

low pass filtering said difference signal;

rotating said low pass filtered difference signal by −90 degrees of angle;

simultaneously processing said control signals in said second path by low pass filtering said control signals; and selecting either said rotated low pass filtered difference signal of said first path or said low pass filtered control signals of said second path as function of the difference between said rotated low pass filtered difference signal of said first path and said low pass filtered control signals of said second path.

2. The method of claim 1, wherein said selecting is performed by a combination network.

3. The method of claim 1, wherein said control signals are pulse-width-modulated.

4. The method of claim 1, wherein said supply voltages are generated by a multi-phase a.c. voltage supply system with a service device capable of feedback.

5. The method of claim 4, wherein said multi-phase a.c. voltage supply system is three-phased.

6. The method of claim 1, wherein said low pass filtering in said first path is performed at a frequency in the range between approximately 1 to 10 Hz, and simultaneously with it said rotation by approximately −90 degrees of angle.

7. The method of claim 5, wherein said low pass filtering in said first path is performed at a frequency in the range between approximately 1 to 10 Hz, and simultaneously with it said rotation by approximately −90 degrees of angle.

8. The method of claim 1, wherein said low pass filtering in said second path is performed at a frequency between approximately 1 kHz to 3 kHz.

9. The method of claim 5, wherein said low pass filtering in said second path is performed at a frequency between approximately 1 kHz to 3 kHz.

10. The method of claim 6, wherein said low pass filtering in said second path is performed at a frequency between approximately 1 kHz to 3 kHz.

11. The method of claim 7, wherein said low pass filtering in said second path is performed at a frequency between approximately 1 kHz to 3 kHz.

12. The method of claim 1, wherein said selected signal is an output signal of said first path when there are small differences between signal amplitudes of output signals of said first and second paths, and said selected signal is an output signal of said second path when there is not a small difference between said signal amplitudes.

13. The method of claim 1, wherein said control signals are generated by commutation chokes.

14. The method of claim 1, wherein said processing said control signals within said first path further comprises:

forming a second difference signal from two of said control signals;

low pass filtering said second difference signal;

rotating said second low pass filtered difference signal by −90 degrees of angle;

forming a third difference signal between said first and second difference signals.

15. A circuit arrangement for generating representations of supply voltages, comprising:

a first path that receives control signals, said first path comprising a subtracter for forming a difference signal from two of said control signals and a low pass filter to receive said difference signal;

a second path that receives said control signals, said second path comprises a second low pass filters that passes frequencies higher than said first low pass filter does; and wherein output signals of said first and second paths are fed to a combination network which, as a function of the difference between said output signals of said first and second paths, passes on the output signals of one of said first and second paths.

16. The circuit arrangement of claim 15, wherein said supply voltages are generated by a multi-phase a.c. voltage supply system with a service device capable of feedback.

17. The circuit arrangement of claim 16, wherein said service device comprises frequency converters of electric motors.

18. The circuit arrangement of claim 15, wherein said first low pass filter comprises a low pass filter of the first or second order.

19. The circuit arrangement of claim 15, wherein said second low pass filter has a frequency above the frequency of the supply voltage.

20. The circuit arrangement of claim 18, wherein said second low pass filter has a frequency above the frequency of the supply voltage.

21. The circuit arrangement of claim 15, comprising a third low pass filter, which has a frequency between approximately 0.5 kHz to 2 kHz, is connected in series to said first low pass filter.

22. The circuit arrangement of claim 18, comprising a third low pass filter, which has a frequency between approximately 0.5 kHz to 2 kHz, is connected in series to said first low pass filter.

23. The circuit arrangement of claim 19, comprising a third low pass filter, which has a frequency between approximately 0.5 kHz to 2 kHz, is connected in series to said first low pass filter.

24. The circuit arrangement of claim 20, comprising a third low pass filter, which has a frequency between approximately 0.5 kHz to 2 kHz, is connected in series to said first low pass filter.

25. The circuit arrangement of claim 15, wherein said combination network causes an output signal of said first path to be fed to a resistor and thereafter to a summation point, and said combination network causes an output signal of said second path to be fed to a diode network and thereafter to said summation point.

26. The circuit arrangement of claim 25, wherein said combination network comprises two parallel switched groups of series-connected diodes so that, as a function of the number of series-connected diodes, signals with a small amount of amplitude are not fed to said summation point.

* * * * *

UNITED STATES PATENT AND TRADEMARK OFFICE
CERTIFICATE OF CORRECTION

PATENT NO. : 6,181,582 B1
DATED : January 30, 2001
INVENTOR(S) : Norbert Huber

It is certified that error appears in the above-identified patent and that said Letters Patent is hereby corrected as shown below:

<u>Title page,</u>
Item [30], Foreign Application Priority Data, change "199 09 706" to
-- 199 09 706.2 --.
Item [56], References Cited, under U.S. PATENT DOCUMENTS, insert the following:
-- 4,369,366      1/1983         Schmitt --.
-- 4,594,538      6/1986         Schmitt
   4,894,762      1/1990         Steinshorn --.

Insert the following:
              -- FOREIGN PATENT DOCUMENTS
37 38 180      5/1989         W. Germany
0 353 569      2/1990         EP
196 50 695     4/1998         Germany --.

Insert the following:
              -- OTHER PUBLICATIONS
English language Abstract regarding Japanese
Patent Publication 08322269, published December 3,
1996, Patent Abstracts of Japan, 1996 --.

Signed and Sealed this

Second Day of July, 2002

Attest:

Attesting Officer

JAMES E. ROGAN
*Director of the United States Patent and Trademark Office*